United States Patent [19]

Hertzberg et al.

[11] Patent Number: 4,824,381

[45] Date of Patent: Apr. 25, 1989

[54] CIRCUIT BOARD CONTAINING A METAL NET

[75] Inventors: Tommy H. Hertzberg, Perstorp; Bernt Ekström, Tyringe, both of Sweden

[73] Assignee: Perstorp AB, Perstorp, Sweden

[21] Appl. No.: 149,928

[22] Filed: Jan. 29, 1988

Related U.S. Application Data

[63] Continuation of Ser. No. 942,780, Dec. 17, 1986, abandoned.

[30] Foreign Application Priority Data

Dec. 23, 1985 [SE] Sweden ................................ 8506105

[51] Int. Cl.$^4$ ............................................. H01R 13/48
[52] U.S. Cl. ........................................ 439/87; 439/86
[58] Field of Search ...................... 140/6, 7, 9; 245/1, 245/8; 428/255, 256; 439/65, 86, 87

[56] References Cited

U.S. PATENT DOCUMENTS

| | | | |
|---|---|---|---|
| 2,962,057 | 11/1960 | Webber | 245/8 |
| 3,297,461 | 1/1967 | Siddall | 245/8 X |
| 3,615,373 | 10/1971 | Bangert | 245/8 X |
| 3,936,548 | 2/1976 | Konicek . | |
| 4,569,692 | 2/1986 | Butt | 428/426 X |
| 4,711,804 | 12/1987 | Burgess | 428/432 X |
| 4,754,546 | 7/1988 | Lee et al. | 439/86 X |

FOREIGN PATENT DOCUMENTS

430742 of 0000 Sweden .

*Primary Examiner*—Timothy V. Eley
*Attorney, Agent, or Firm*—Stevens, Davis, Miller & Mosher

[57] ABSTRACT

Metal net, mainly intended for the production of printed circuit boards. Said net is made of covar, molybdenum, invar or wolfram and is possibly coated with copper.

11 Claims, No Drawings

CIRCUIT BOARD CONTAINING A METAL NET

This application is a Continuation of application Ser. No. 942,780, filed Dec. 17, 1986, now abandoned.

The present invention relates to a metal net, mainly intended for the production of printed circuit boards and the use of such a net.

Printed circuit boards are used to a large extent in the electronics industry. Printed circuit boards are usually produced by placing a copper foil on one or both sides of one or more layers of a fiber material (so-called prepreg) impregnated with partially cured plastic.

Then pressing at a high pressure and an elevated temperature is carried out. Hereby a final curing of the plastic, which is binding the fiber material to a sheet (an insulating carrier), is obtained. The copper foil is firmly bonded to said sheet.

The most common insulating bases are paper-reinforced phenol formaldehyde plastic laminates, which are used for comparatively simple circuits, and glass cloth reinforced epoxy resin laminates, which are used where the technical requirements are higher.

The copper foil has usually a thickness of 15–35$\mu$, but also foils with a thickness of e.g. 5$\mu$ can be used if the temporary carrier process in accordance with the U.S. Pat Re. 29,820 is used. Also copper foils in thicknesses of more than 35$\mu$ are used in some cases.

After the pressing, a copy of the desired wiring pattern is transferred to the copper layer for instance by printing or by a photo-chemical method. The applied copy, the so-called etch resist, acts as a protection during a subsequent elimination by etching of superfluous copper. Thereafter, the electronic components are mounted to the laminate with the circuit thus obtained, the so-called printed circuit board. The copper conductors of the circuit constitute the required electrical connections and the laminate provides the mechanical support. This technique provides good possibilities of space and weight saving build-up of the electronic unit. The method affords high reliability and rational production. Also so-called multilayer boards are very common nowadays.

Said multilayer boards consist of a number of copper layers with wiring patterns which are separated by insulating layers and laminated as described above.

For a long period of time, the trend in the electronics field has been towards increased complexity with more and more electronic components per surface area. In the last few years the subject of the discussions has to a large extent related to the concept of surface mounting, i.e. printed circuit boards having the components mounted directly on the copper surface of the board by means of soldering. This eliminates the drilling of holes for the component legs, which was done previously, and is consequently very space-saving. Surface mounting is mostly used on multilayer boards and it makes it possible to increase the packaging density by 200–300%.

However, an increased packaging density results in an increased heat release per surface area. This in turn gives thermal problems, especially as regards surface mounted boards.

A ceramic chip carrier (C.C.C.) has a thermal coefficient of expansion (TCE) of about 7 ppm/°C. The corresponding value for copper is 16 and for glass cloth reinforced epoxy resin laminate 12–16.

Heating of the surface mounted components in the form of such ceramic chips results in a shearing in the soldered joints since the carrier expands to a larger extent than the C.C.C. This shearing can result in cracking of the soldered joint or in complete loosening of the component. In either case, the life of the board is drastically reduced.

Different methods are used to overcome this problem. One method is to exchange the ceramic of the components for other materials having a TCE which is adapted in a better way to the TCE of the substrate. Another method is to reduce the coefficient of thermal expansion of the carrier in various ways. As regards the first method, there are currently no commercially useful materials except for plastic chip carriers. The problems with said plastic chip carriers are solderability and difficulties to obtain completely tight carriers. As regards the second method, trials have been made to exchange the glass cloth reinforcement for other materials having a lower TCE, e.g. carbon fibre or quartz. However, these materials cause problems, such as water absorption, delamination, drilling difficulties etc.

According to the present invention it has quite surprisingly been possible to solve the above-mentioned problem with different coefficients of thermal expansion of the surface mounted ceramic components and the substrate (the printed circuit board). Thus, a metal net mainly intended for the production of printed circuit boards has been brought about. Said net is characterized in that is made of Covar, molybdenum, Invar or wolfram. Optionally, the net is provided with a copper coating.

The net is intended to be used as a ground plane, a power plane and/or a layer reducing the thermal expansion of a printed circuit board, preferably a multilayer board having a TCE of 5–9, preferably 6–8 ppm/°C.

The net of the present invention has also the advantage that the dimensional stability of the printed circuit board increases. Moreover, the net provides an electromagnetic shielding. Finally, the very good adhesion between the net and the insulating base material of the board decreases the risk of delamination caused by interface stresses.

The possible copper coating of the net is suitably electro-plated or chemically deposited. If desired, the coating can be provided in such a manner that the gaps between the netting meshes are completely filled with copper.

Thus, according to the invention it is possible to produce printed circuit boards, especially multilayer boards, having the desirable low (6–8 ppm/°C) coefficient of thermal expansion by varying the number of metal nets with a suitable thickness in proportion to the number of prepreg layers with a suitable thickness, which are used for the manufacture of the printed circuit boards.

Since the printed circuit board obtains the same coefficient of thermal expansion as the ceramic chip carriers being used as surface mounted components, the thermal problem described above is avoided.

According to the invention, the metal net can be produced in a width adapted to common laminate presses. Usually, the net has a with of 1 meter and an overall thickness of 50–2000$\mu$, preferably 50–500$\mu$. Since the net is produced continuously, it can be obtained in the desired length in the form of rolls.

The net can be coated with a partially cured resin such as phenolic resin, epoxy resin or polyimide and can then be compared with so-called prepregs of paper or glass cloth impregnated with the corresponding type of resin.

The invention will be disclosed in more detail below in connection with the embodiment examples, of which Example 1 relates to an Invar net coated with epoxy resin, and Example 2 relates to an Invar net coated with copper by means of electro-plating.

Example 1

A net made of Invar wire with a wire diameter of 125μ was coated with an epoxy resin by means of dipping. The net had a square bar pattern where the side of the squares was 200μ.

The coated net was dried for 5 minutes at a temperature of 130° C., whereby a partially cured (so-called B-stage) resin was obtained. The resin content of the resin coated net thus obtained was 40 per cent by weight. The resin had a flow rate of 15%, a gel time of 150 s. and a volatile content of 0.5% (in accordance with MIL-P-13949 F).

One or more such coated nets together with a suitable number of sheets of epoxy resin impregnated glass cloth and copper foil sheets were pressed at high pressure and elevated temperature thus forming a laminate intended for the production of printed circuit boards with the desired coefficient of thermal expansion. At the pressing the final curing of the resin was obtained in the usual way.

Example 2

A net made of Invar wire with a wire diameter of 100μ was electro-plated in a water bath having the following composition:
$Cu_2P_2O_7 \cdot 4H_2O$, 50 g/l
$K_4P_2O_7$, 240 g/l
Time 85 s.
Cathode current density 2 A/dm$^2$
Temperature 50° C.
pH 8.6.

The net had a square bar pattern where the side of the squares was 200μ.

Thereafter, the net was electro-plated in a water bath containing:
$CuSO_4$, 125 g/l
$H_2SO_4$, 70 g/l
Cathode current density 20 A/dm$^2$.

Time 12 min. The copper coated net was pressed towards prepregs of glass cloth impregnated with epoxy resin.

We claim:

1. A printed circuit board which comprises as a part of the circuit board at least one metal net made of a material taken from the group consisting of Covar, Invar, molybdenum or wolfram.

2. A printed circuit board according to claim 1, wherein the net has been provided with a copper coating.

3. A printed circuit board according to claim 2, wherein the net has been provided with a copper coating by electroplating or chemical deposition.

4. A printed circuit board according to claim 1, wherein the overall thickness of the net is 50–2000μ.

5. A printed circuit board according to claim 1, wherein the overall thickness of the net is 50–500μ.

6. A printed circuit board according to claim 1 or claim 9, wherein the net has been coated with a partially cured resin selected from the group consisting of epoxy resin polyimide resin or phenolic resin.

7. A printed circuit board according to claim 1, wherein the board is a multilayer board with a coefficient of thermal expansion of 5–9 ppm/°C.

8. A printed circuit board according to claim 7, wherein the coefficient of thermal expansion is 6–8 ppm/°C.

9. A printed circuit board according to claim 1, wherein the metal net is used as a ground plane.

10. A printed circuit board according to claim 1, wherein the metal net is used as a power plane.

11. A printed circuit board according to claim 1, wherein the metal net is used as a layer reducing the thermal expansion of the printed circuit board.

* * * * *